United States Patent
Tsorng et al.

(10) Patent No.: US 10,720,722 B2
(45) Date of Patent: Jul. 21, 2020

(54) ELECTRONICS CONNECTOR FOR FACILITATING TREATMENT

(71) Applicant: QUANTA COMPUTER INC., Taoyuan (TW)

(72) Inventors: Yaw-Tzorng Tsorng, Taoyuan (TW); Shin-Ming Su, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/131,924

(22) Filed: Sep. 14, 2018

(65) Prior Publication Data

US 2020/0091640 A1    Mar. 19, 2020

(51) Int. Cl.
| H01R 12/73 | (2011.01) |
| H01R 12/70 | (2011.01) |
| H01R 12/72 | (2011.01) |
| H01R 43/20 | (2006.01) |

(52) U.S. Cl.
CPC ....... H01R 12/737 (2013.01); H01R 12/7023 (2013.01); H01R 12/721 (2013.01); H01R 43/205 (2013.01)

(58) Field of Classification Search
CPC .. H01R 12/73; H01R 12/737; H01R 12/7023; H01R 12/721
USPC .......................................................... 439/68
See application file for complete search history.

(56) References Cited

U.S. PATENT DOCUMENTS

| 4,070,081 A * | 1/1978 | Takahashi ............ H01R 13/629 |
| | | 439/372 |
| 4,858,309 A * | 8/1989 | Korsunsky ......... H01R 12/7005 |
| | | 29/764 |
| 5,318,452 A * | 6/1994 | Brennian, Jr. ....... G06K 7/0047 |
| | | 439/541.5 |
| 5,676,561 A * | 10/1997 | Chiang ................ H05K 7/1409 |
| | | 439/157 |

(Continued)

FOREIGN PATENT DOCUMENTS

| CN | 207853057 | * | 9/2018 | ............. H01R 21/73 |
| CN | 207853057 U | | 9/2018 | |

(Continued)

OTHER PUBLICATIONS

Attend Technologies Inc.; M.2 Connector (NGFF) Introduction; Feb. 3, 2014 (Feb. 3, 2014), pp. 1-9, XP055624301, Retrieved from the Internet: URL:https://web.archive.org/web/20140203000954if_/http://www.orvem.eu/attachments/article/130/M%202%20introduction.pdf.

(Continued)

Primary Examiner — Peter G Leigh
(74) Attorney, Agent, or Firm — Nixon Peabody LLP

(57) ABSTRACT

In the production of certain components, the components must pass through an existing treating device with limited clearance. This limited clearance will cause unwanted physical contact between the component and the existing treatment apparatus, such as a reflow oven for treating electronic components, such as an M.2 connector. In such a situation, it will be necessary to practice a method of separating the component into subassemblies or modules; separately treating the subassemblies or modules in the reflow oven; and then reassembling the subassemblies and modules after the reflow treatment.

10 Claims, 8 Drawing Sheets

(56) References Cited

U.S. PATENT DOCUMENTS

| | | | | |
|---|---|---|---|---|
| 5,762,513 | A * | 6/1998 | Stine | H01R 13/6273 439/358 |
| 5,943,218 | A * | 8/1999 | Liu | H05K 7/1405 361/679.32 |
| 6,007,357 | A * | 12/1999 | Perino | H01R 12/7005 439/327 |
| 6,056,579 | A * | 5/2000 | Richards, III | H05K 7/1454 439/327 |
| 6,059,585 | A * | 5/2000 | Liao | H05K 7/1409 439/155 |
| 6,164,990 | A * | 12/2000 | Yu | H05K 7/1405 439/135 |
| 6,176,727 | B1 * | 1/2001 | Liu | H01R 12/7005 439/327 |
| 6,276,950 | B1 * | 8/2001 | Yodogawa | H01R 12/7005 439/160 |
| 6,319,037 | B1 * | 11/2001 | Lai | H01R 12/7005 361/801 |
| 6,887,095 | B2 * | 5/2005 | Simon | H01R 9/2475 439/488 |
| 7,488,192 | B1 | 2/2009 | Eagle et al. | |
| 8,559,187 | B2 * | 10/2013 | Peng | H05K 7/1431 361/798 |
| 9,400,533 | B2 * | 7/2016 | Shen | G06F 1/203 |
| 9,509,094 | B2 * | 11/2016 | Mathews | H01R 12/79 |
| 9,640,910 | B1 * | 5/2017 | Chien | H01R 13/6275 |
| 9,761,996 | B2 * | 9/2017 | Lin | H01R 12/73 |
| 10,054,992 | B1 | 8/2018 | Ehlen | G06F 1/182 |
| 10,064,299 | B2 * | 8/2018 | Chen | F16M 13/022 |
| 2008/0050955 | A1 * | 2/2008 | Chen | H01R 12/7005 439/159 |
| 2008/0176432 | A1 * | 7/2008 | Scherer | H01R 12/7005 439/159 |
| 2012/0149223 | A1 * | 6/2012 | Feldman | H01R 13/62933 439/157 |
| 2012/0218705 | A1 * | 8/2012 | Huang | G06F 1/187 361/679.37 |
| 2013/0288504 | A1 * | 10/2013 | Sass | H01R 12/7029 439/328 |
| 2017/0005422 | A1 * | 1/2017 | So | H01R 12/7076 |
| 2018/0062287 | A1 * | 3/2018 | Shaw | H01R 13/639 |
| 2018/0101500 | A1 * | 4/2018 | Heyd | G06F 13/4022 |
| 2018/0102600 | A1 * | 4/2018 | Lai | H01R 12/7005 |
| 2019/0067838 | A1 * | 2/2019 | Ju | H01R 12/716 |

FOREIGN PATENT DOCUMENTS

| | | |
|---|---|---|
| EP | 0926779 A1 | 6/1999 |
| TW | 201711305 A | 3/2017 |

OTHER PUBLICATIONS

Extended European Search Report for EP Application No. 19161877.6, dated Oct. 4, 2019.
TW Office Action for Application No. 108103155, dated Feb. 26, 2020, w/ First Office Action Summary.
TW Search Report for Application No. 108103155, dated Feb. 26, 2020, w/ First Office Action.

* cited by examiner

US 10,720,722 B2

ELECTRONICS CONNECTOR FOR FACILITATING TREATMENT

FIELD

The present invention relates to electronic connectors for computing device, and more specifically to for electronic connectors that facilitating treatment thereof and related methods.

BACKGROUND

Many electronic components are now being designed after the existing apparatus to treat the component was designed. In some instances, the treatment apparatus does not have the clearance necessary to permit the component to be treated without unwanted physical contact between the component and the treatment apparatus. That is, the component's dimensions exceed that of the treatment apparatus. One treatment apparatus typically used for computing device components is a reflow oven in which a solder paste is used to temporarily attach one or several electronic components to their contact pads. Afterwards, the entire assembly is subjected to controlled heat, which melts the solder paste to permanently attach the electronic components. However, many reflow ovens only have a limited clearance height, e.g., 30 mm. Thus, use of such reflow ovens can be challenging when the electronic components, alone or aggregately, exceed the oven's clearance height.

SUMMARY

The present disclosure concerns various embodiments for reconfigurable connectors for computing devices adapted for use with limited clearance treatment apparatus, such as reflow ovens. In some embodiments, a vertical M.2 connector (e.g., Memory, PCI-E, Wi-Fi/Bluetooth, WWAN, cellular cards, SATA devices) is provided, where the connector is configured to allow separation of the connector into smaller sized parts or modules (e.g., latch and base). For example, one or more portions of the latch can be configured for vertical or lateral movements relative to the base to disassemble and reassemble the connector. This configuration allows results in smaller parts after disassembly and allows for treatment of these smaller parts in a reflow oven or other treatment apparatus without clearance issues. The connector is also configured so that the treated parts can be easily reassembled after treatment. For example, the connector is configured for disassembly so as to allow the latch to be separately treated from the base, and then reassembled after treatment. In particular embodiments, a module can be inserted into the base before or after treatment and/or reassembly.

In other embodiments, one or more portions of the latch may be pivotably configured so as to reduce the overall height of the connector to less than the clearance of the reflow oven or other treatment apparatus. For example, one or more parts of the latch are pivotably connected to other parts of the latch. Alternatively, the latch can be pivotably connected to the base.

In particular embodiments, after treatment of the connector with a pivotable latch, a module may be inserted into the base, and the latch can be rotated to secure the module in the connector. However, the module may also be inserted into the base prior to treatment, with the latch being rotated after treatment to secure the module. In still other embodiments, the latch and module may be joined and heat treated separately from the base.

DETAILED DESCRIPTION OF THE EMBODIMENTS

Figure 1:
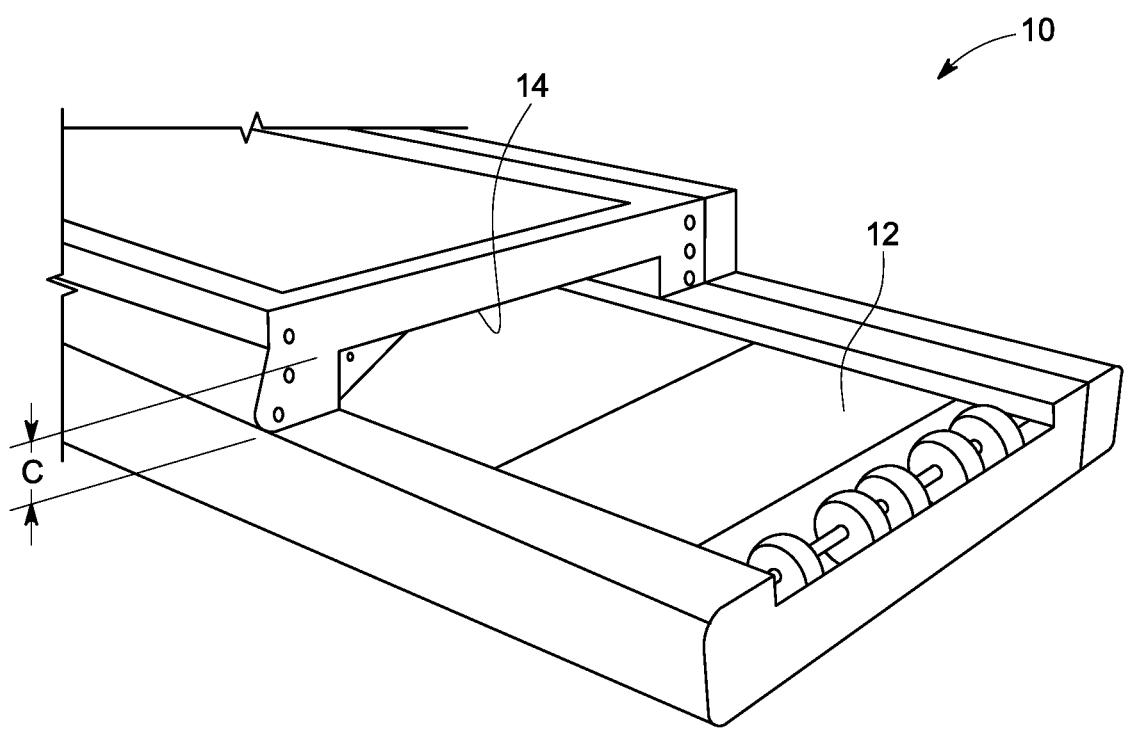
FIG. 1 is a perspective view of an existing reflow oven.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. Those skilled in the art will appreciate that not every element is visible in each figure of the drawings. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

M.2 (formerly known as the Next Generation Form Factor (NGFF)) is a specification for internally mounted computer expansion cards and associated connectors. It replaces the mSATA standard, which uses the PCI Express mini Card physical card layout and connectors. M.2's more flexible physical specification allows for different module widths and lengths; and makes the M.2 more suitable than mSATA for solid-state storage application in general and particularly for the use in small devices, such as ultrabooks or tablets. Such flexibility in dimensions have not only made the M.2 connector more popular, but has also produced demands by the industry to increase its size. However, existing reflow ovens and other treatment apparatus were sized without taking into account the possible larger dimensions to which the M.2 connectors are currently being manufactured. Thus, it is difficult, or impossible, to feed oversize M.2 connectors through existing reflow ovens or other treatment apparatus without encountering contact interference of the connector and oven clearances. Thus, this disclosure provides several alternatives to treat the oversized M.2 connector and other oversized connectors in existing reflow ovens or other existing treatment apparatus of limited dimensional clearance.

Although the various embodiments will be described primarily with reference to reflow ovens for M.2 connectors, the present disclosure is not limited in this regard. Rather the present disclosure contemplates that the teachings herein are applicable to configuring any type of electronic components for use with any type of treatment apparatus with a limited size opening or aperture.

In a reflow oven, a previously applied solder paste liquefies under the heat of the oven and bonds the parts of an M.2 connector. Thus, it is essential that the arrangement of the parts being treated is not disturbed via unwanted physical contact with the oven before the final bond is formed. This challenge is described below with respect to FIGS. 1 and 2.

FIG. 1 is a perspective view of an existing reflow oven 10. The reflow oven comprises an aperture or opening 14 and a conveyor 12. Parts can be placed on the conveyor 12 to be conveyed in the reflow oven through aperture 14. The dimension "C" in FIG. 1 is the limiting clearance for the aperture 14, and thus defines a maximum height of a part on the conveyor 12 to be treated.

Figure 2:
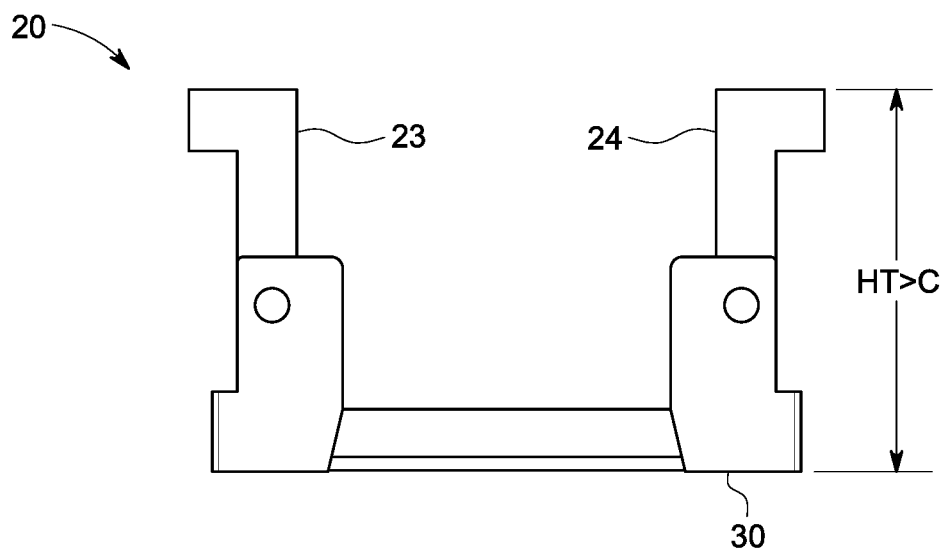
FIG. 2 is a schematic of a typical assembled M.2 connector.

FIG. 2 shows a typical M.2 connector 20. M.2 connector 20 comprises a base 30 and upstanding latches 23, 24. Optionally, the base 30 can be attached to a supporting PCB. When correctly positioned on base 30, the latches 23, 24 can provide an overall height for the M.2 connector 20 that may exceed the clearance dimension C of reflow oven 10 in FIG. 1. Thus, if the M.2 connector 20 of FIG. 2 were placed on conveyor 12 of FIG. 1 in a vertical orientation (as shown in FIG. 2), the M.2 connector 20 of FIG. 2 has the potential to come into physical contact with the reflow oven 10 of FIG. 1. Depending on the degree to which the M.2 connector 20 in FIG. 2 exceeds the clearance C of reflow oven 10 in FIG. 1, M.2 connector 20 of FIG. 2 would either be knocked over on its side, be forcibly compressed within reflow oven 10, or even cause components of the M.2 connector 20 to separate.

Figure 3:
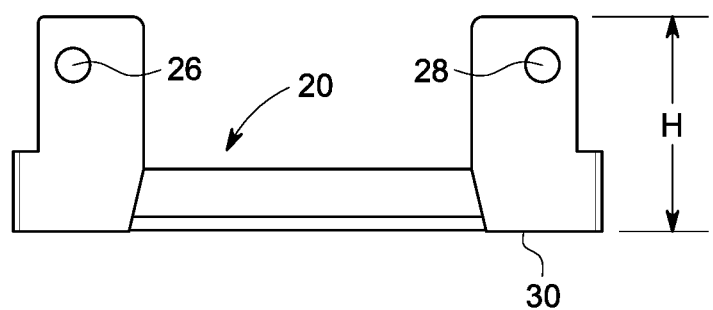
FIG. 3 is an elevation view of an M.2 connector base.

Turning now to FIG. 3, which shows the base 30 of M.2. connector 20, the present inventors have observed that the base 30 will have a height "H" that is significantly smaller than a height of the complete M.2. connector 20 shown in FIG. 2. Thus, the base 30 alone could enter the reflow oven 10 (in FIG. 1) without making any unwanted physical contact. The present disclosure leverages this fact to provide various configurations for an M.2 connector and other similar electronic components so as to avoid the unwanted physical contact issues with existing reflow ovens or other treatment devices.

Figure 4A:
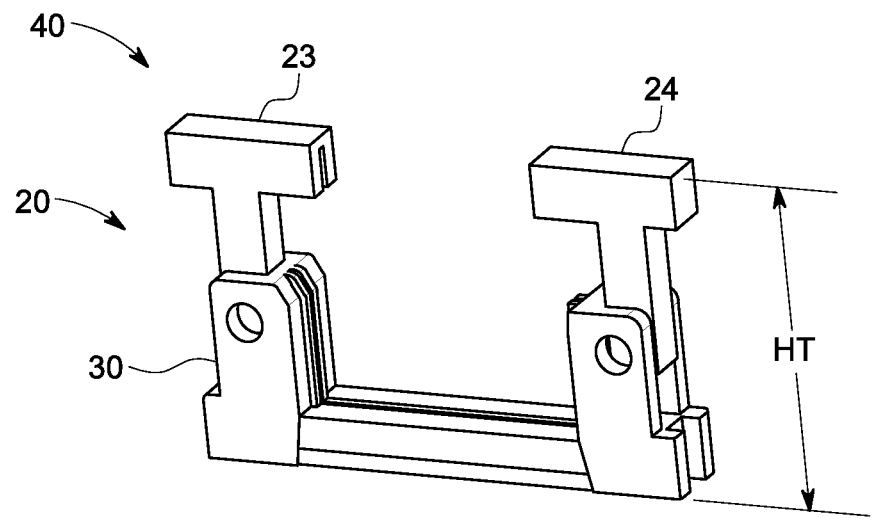
FIG. 4A is a perspective view of an M.2 connector according to an embodiment.
Figure 4B:
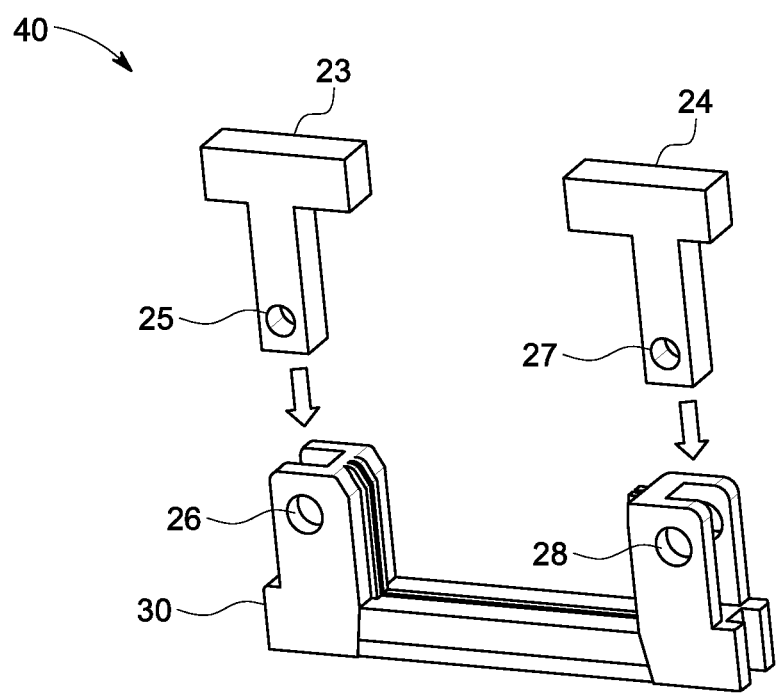
FIG. 4B is an exploded view of FIG. 4A.

Turning first to FIGS. 4A and 4B, there is shown an exemplary embodiment for M.2 connector 40 in which a vertical disassembly configuration is provided. FIG. 4A shows an assembled arrangement of M.2 connector 40, presenting a height "HT". As discussed above, height "HT" could exceeds the clearance of an existing reflow oven. In this embodiment, the latches 23 and 24 can be removed from M.2 connector 40 by a vertical motion relative to base 30. This is illustrated in FIG. 4B. Each of the resulting smaller components or subassemblies can then fit into an existing reflow oven with a lower risk of unwanted physical contact. After treatment, the components can be reassembled. In some embodiments, latch 23 can be provided with a boss 25, which fits into aperture 26 of base 30. Similarly latch 24 can be provided with boss 27, which interfits into aperture 28 in base 30. The latches 23, 24 will be retained to the base 30 when the respective bosses 25, 27 are fitted into apertures 26, 28 of base 30 as shown in FIG. 4A. In some circumstances, the latches 23, 24 can be replaced with latches of different length. For example, an M.2 module of the short type could be replaced by the customer with an M.2 module of the long type. In that instance, the latches 23, 24 could be removed from base 30 and replaced by latches of longer length. The customer need not replace the connector, which might be attached to a PCB, but would merely replace the latch.

Figure 5A:
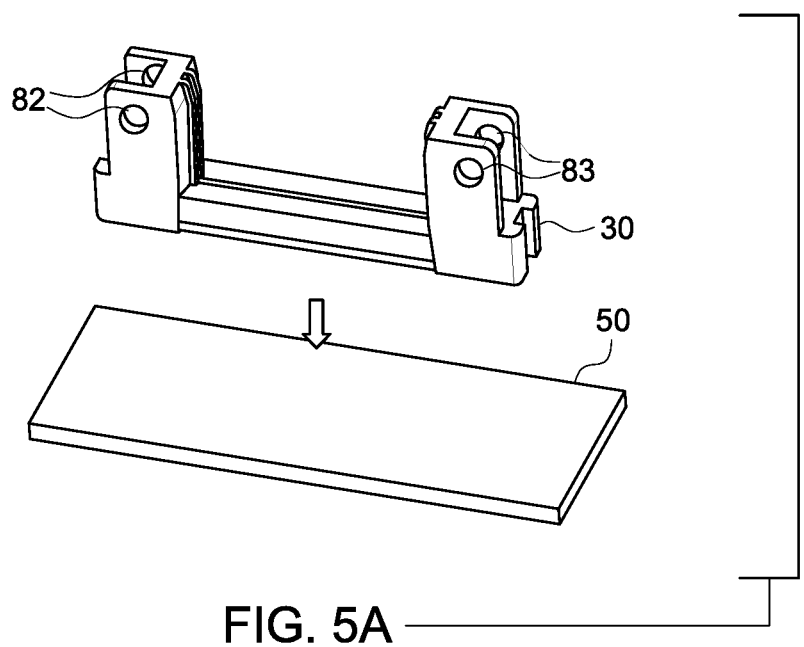
FIG. 5A illustrates an unassembled view of an M.2 connector with a base providing for pivoting latches connected to a PCB according to an embodiment.
Figure 5B:
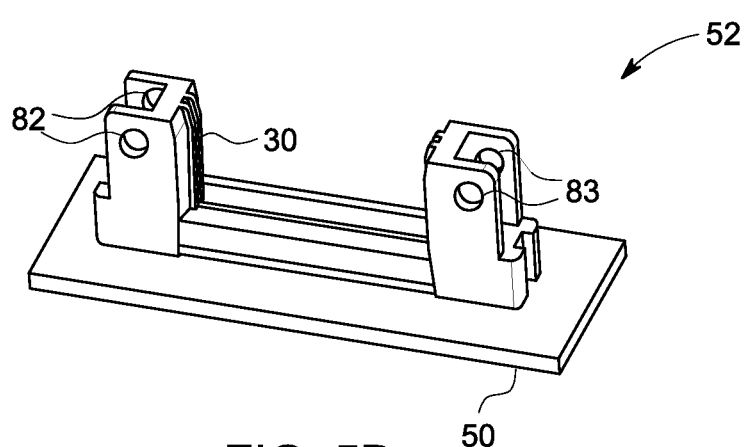
FIG. 5B is an assembled view of FIG. 5A.

Alternatively, the latches can be repositioned via rotation. The provision of rotation is permitted due to the presence of pivots 82, 83 in base 30 as shown in FIGS. 5A and 5B, which show an exemplary embodiment for an M.2. connector 85 in which pivoting of latching components is provided in order to reduce a height of the M.2 connector. In FIGS. 5A and 5B, the M.2 connector 85 is shown including the optional supporting PCB 50 attached to the base 30.

Figure 6A:
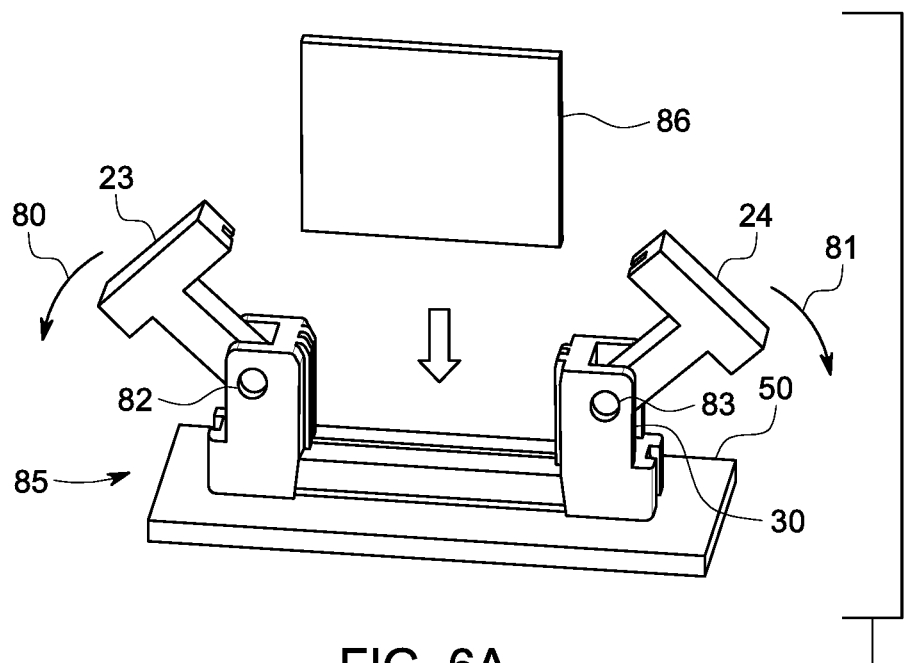
FIG. 6A illustrates an unassembled view of an M.2 connector with a vertically moving one-part latch according to an embodiment.
Figure 6B:
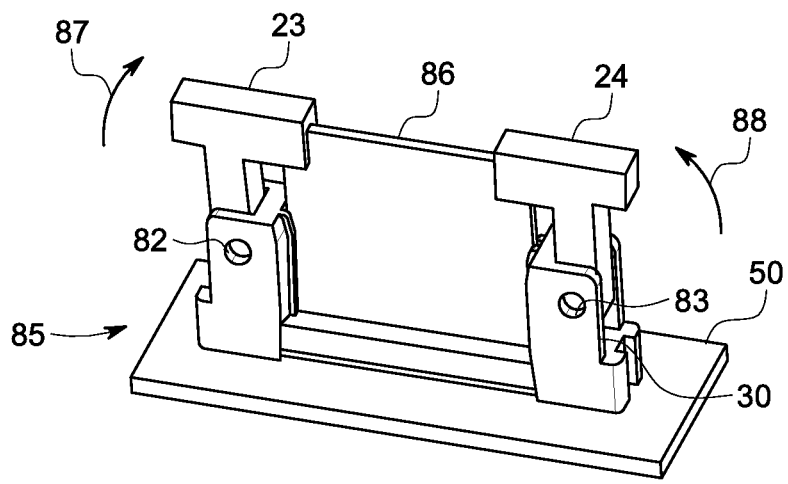
FIG. 6B is an assembled view of FIG. 6A

As shown in FIG. 6A, the latches 23, 24 are attached to base 30 with pivots 82, 83. Pivots 82, 83 permit each of the latches 23, 24 to rotate relative to base 30. As shown by arrows 80, 81, the latches 23, 24, respectively, are rotated downwardly towards PCB 50 to reduce the overall height of the M.2 connector 85. FIG. 6B shows that after treatment, latches 23, 24 can be rotated towards one another, as shown in by arrows 87, 88. FIGS. 6A and 6B also show that the rotation of the latches 23, 24 can be used to position and secure an electronic component or module 86 in the M.2 connector 85. Module 86 can be, for example, older SATA or PCI-E devices or newer M.2 devices. These can include, but are not limited to, memory devices, Wi-Fi/Bluetooth devices, or cellular card devices. However, the various embodiments of the disclosure are not limited to any particular type of device or dimension thereof for module 86.

In other embodiments, securing of a module is not limited to the configuration illustrated in FIGS. 6A and 6B. Rather, the present disclosure contemplates that an M.2. connector can be configured to allow for a vertical or a lateral motion of latches 23, 34, respectively, to secure module 86 in place and still provide a height reduction of the M.2 connector. This is illustrated in FIGS. 7A, 7B and 7C.

Figure 7A:
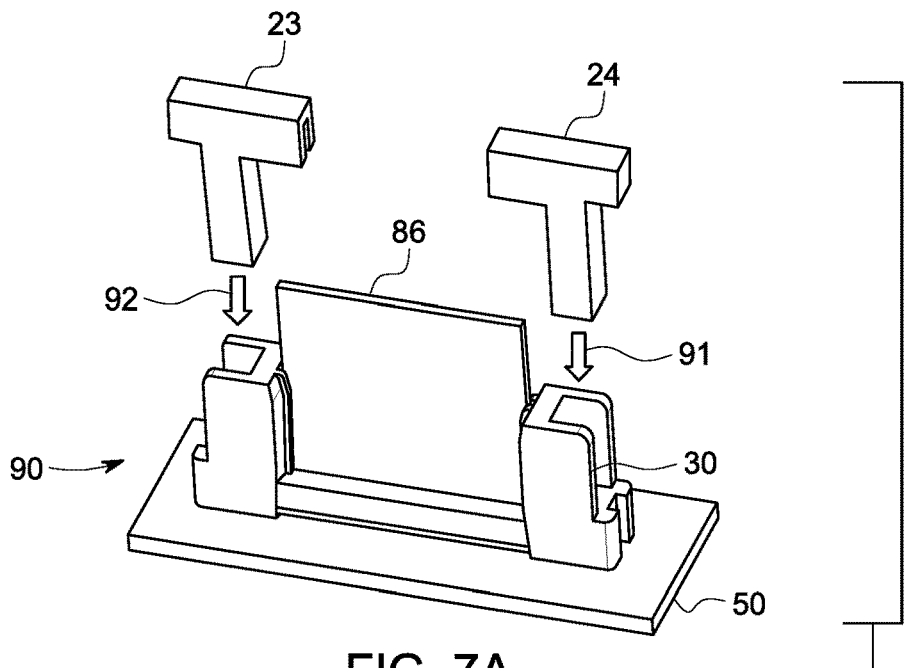
FIG. 7A is a schematic view illustrating vertical joinder of the latches with the base by vertical motion.
Figure 7B:
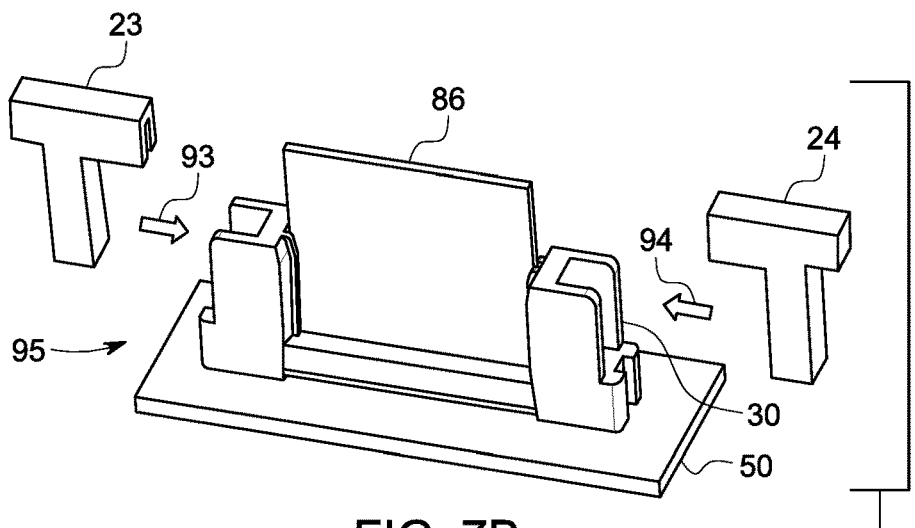
FIG. 7B is a schematic view illustrating the joining of the latches with the base by horizontal motion.
Figure 7C:
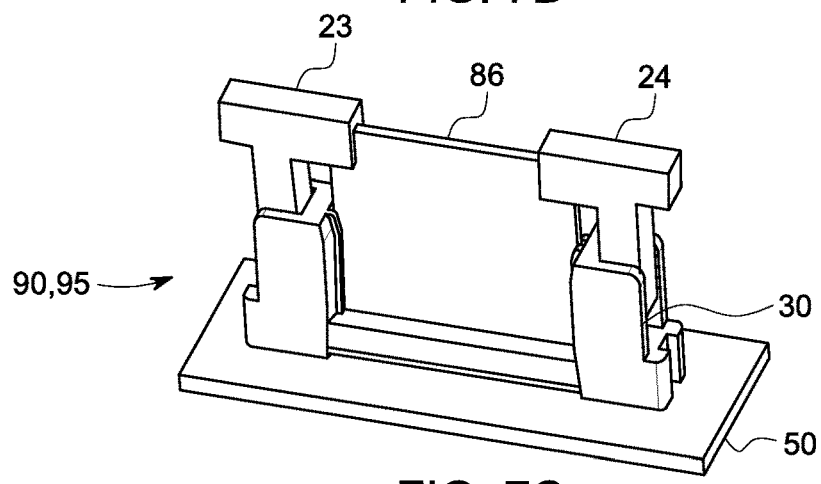
FIG. 7C illustrates an assembled view of an M.2 connector with latches according to an embodiment.

FIG. 7A shows an M.2 connector 90, where the latches 23, 24 may be secured to base 30 by a simple vertical movement, as shown by arrows 91, 92. FIG. 7B shows an M.2 connector 95, where the latches 23, 24 may be secured to base 30 by a simple horizontal movement, as shown by arrows 93, 94. In either configuration, the removal of latches 23, 24 provides the height reduction needed for heat treatment while still providing a mechanism to secure the module 86 in base 30 after reassembly as shown in FIG. 7C.

Figure 8A:
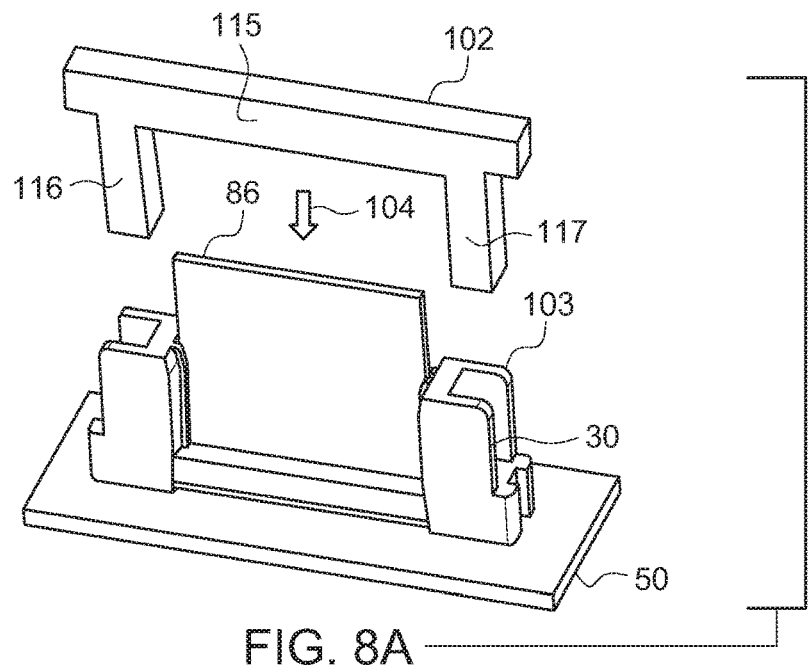
FIG. 8A schematically illustrates a one-part latch joinable with a base by relative vertical motion.
Figure 8B:
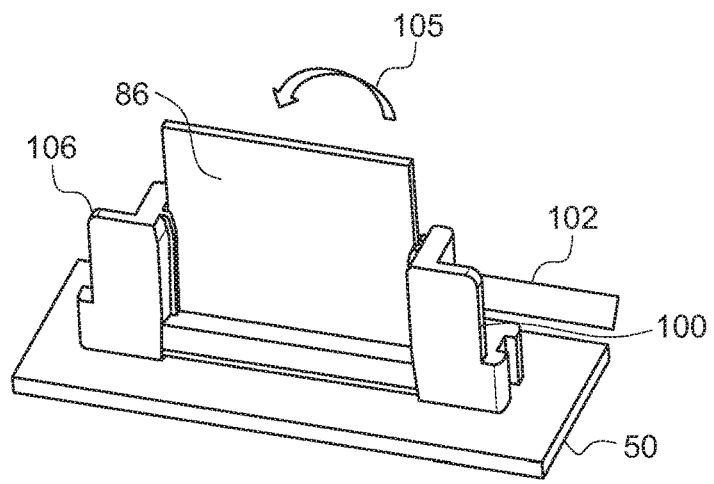
FIG. 8B schematically illustrates a one-part latch joinable to a base by rotational motion.
Figure 8C:
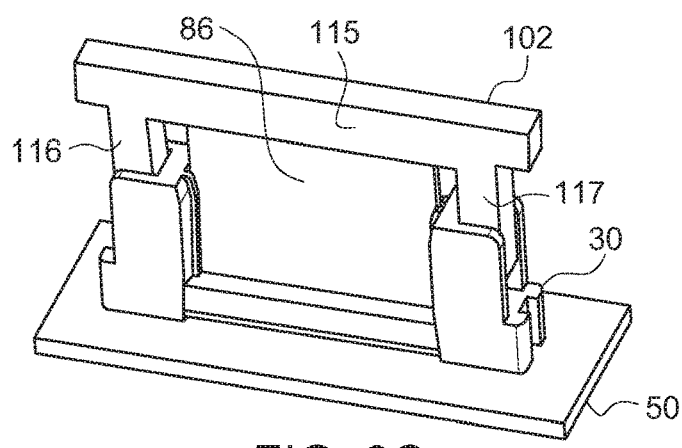
FIG. 8C illustrates the assembled latch and base of FIG. 8A.

In other embodiments, securing of a module is not limited to the dual latch configuration described above. Rather, the present disclosure also contemplates that an M.2. connector can be configured to use a one-part latch. This is illustrated in FIGS. 8A-8C. FIG. 8A shows an M.2 connector 100 in which a one-part latch 102 is provided. The one-part latch 102 includes a longitudinally portion 115 and two depending legs 116, 117 unitary with, and extending from, the longitudinal portion 115. As shown by arrow 104 in FIG. 8A, the one-part latch 102 can be joined to connector base 30 by vertical movement. The one-part latch 102 can also be used to secure a module 86 to the base 30. This is illustrated in FIG. 8C. Alternatively, the one-part latch 102 can be pivotably attached to an M.2 connector 103. This is shown in FIG. 8B. That is, the one-part latch 102 can be configured for rotational movement in the direction of arrow 105. In this configuration, a modified base 106 would be used that omits a rearward retaining wall to permit the rotation of one-part latch 102.

Figure 9A:
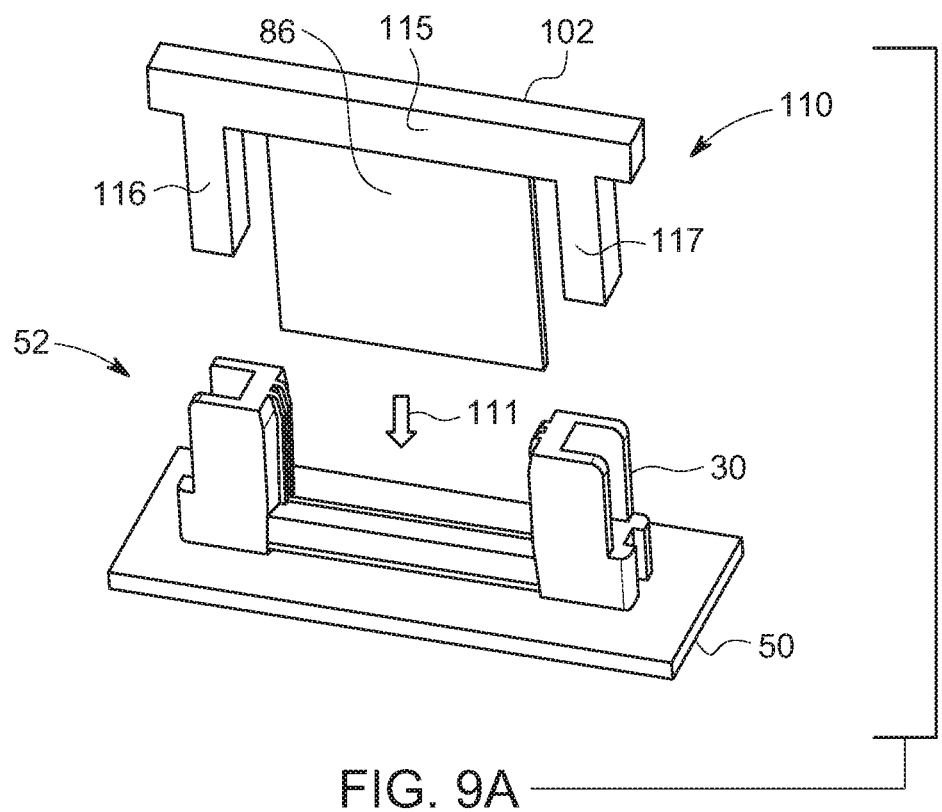
FIG. 9A is an exploded view illustrating a one-part latch having a device module assembled thereto according to one embodiment.
Figure 9B:
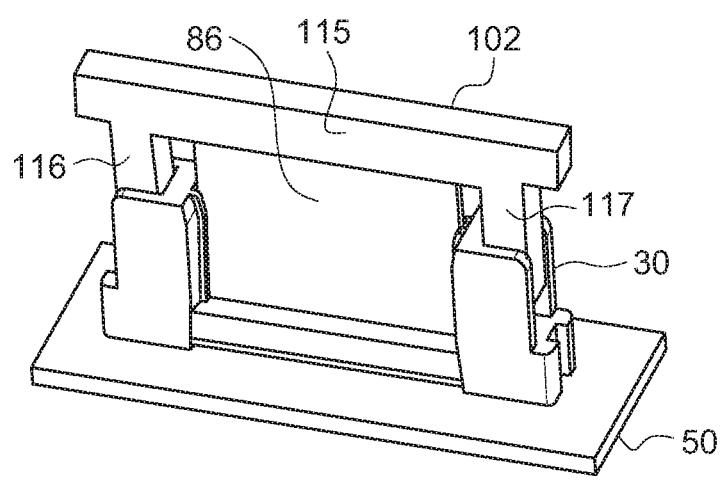
FIG. 9B illustrates the joined latch, module and base of FIG. 9A.

Although the embodiments in FIGS. 8A-8C contemplate that a module is already inserted into a base of the M.2 connector, the various embodiments are not limited in this regard. This is shown in FIGS. 9A and 9B. As shown in FIG. 9A, the one-part latch 102 may be preassembled with module 86 to form a subassembly "module on latch" 110 and heat treated separately from base 30 and supporting PCB 50 (collectively subassembly "module on base" 52). After heat treatment of the subassemblies 52 and 110 in existing reflow oven, the subassemblies can be reassembled by simple vertical movement in the direction of arrow 111 in FIG. 9B.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

We claim:

1. An M.2 connector comprising:
    a first subassembly, the first subassembly comprising an M.2 connector base and a printed circuit board upon which the M.2 connector base is mounted;
    a second subassembly, the second subassembly comprising a one-part latch;
    the one-part latch comprising a longitudinal portion and two depending legs unitary with and extending from the longitudinal portion, whereby the longitudinal portion and the two depending legs are configured to all rotate in an identical direction relative to the M.2 connector base and the printed circuit board;
    each of the first and the second subassemblies being heat treated before the first and second subassemblies are connected to each other.

2. The M.2 connector of claim 1, wherein the first and second subassemblies can be assembled together by relative rotational motion.

3. The M.2 connector of claim 1, further comprising an electronic module inserted into the second subassembly comprising the one-part latch, wherein the one-part latch is connectable to the M.2 connector base by relative vertical motion.

4. The M.2 connector of claim 1, further comprising an electronic module inserted into the M.2 connector base of the first subassembly.

5. The M.2 connector of claim 1, further comprising a replacement second subassembly having a length different than the length of the second subassembly, wherein the second subassembly is removable from the first subassembly for replacement with the replacement second subassembly.

6. The M.2 connector of claim 1, wherein the M.2 connector base includes a first side wall configured to abut a first of the depending legs of the one-part latch, and a second side wall configured abut a second of the depending legs of the one-part latch.

7. The M.2 connector of claim 6, wherein the M.2 connector base omits a first rearward wall abutting the first of the depending legs, and omits a second rearward wall abutting the second of the depending legs, thereby allowing rotation of the one-part latch.

8. An M.2 connector, comprising:
    an M.2 connector base having opposing ends, the M.2 connector base being configured to receive an electronic module between the opposing ends; and
    a one-part latch pivotably coupled to both opposing ends of the M.2 connector base,
    wherein the one-part latch is configured to rotate relative to the M.2 connector base to secure the electronic module in the M.2 connector base.

9. The M.2 connector of claim 8, wherein the M.2 connector base includes a first side wall configured to abut a first depending leg of the one-part latch, and a second side wall configured abut a second depending leg of the one-part latch.

10. The M.2 connector of claim 9, wherein the M.2 connector base omits a first rearward wall abutting the first of the depending legs, and omits a second rearward wall abutting the second of the depending legs, thereby allowing rotation of the one-part latch.

* * * * *